US009116532B2

(12) United States Patent
Usui

(10) Patent No.: US 9,116,532 B2
(45) Date of Patent: Aug. 25, 2015

(54) POWER SEMICONDUCTOR DEVICE MODULE

(71) Applicant: Osamu Usui, Tokyo (JP)

(72) Inventor: Osamu Usui, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 71 days.

(21) Appl. No.: 13/829,418

(22) Filed: Mar. 14, 2013

(65) Prior Publication Data

US 2014/0035658 A1    Feb. 6, 2014

(30) Foreign Application Priority Data

Aug. 3, 2012    (JP) ................................ 2012-172464

(51) Int. Cl.
  *H01L 25/00* (2006.01)
  *G05F 1/10* (2006.01)
  *H01L 23/00* (2006.01)

(52) U.S. Cl.
  CPC *G05F 1/10* (2013.01); *H01L 24/34* (2013.01); *H01L 2224/48091* (2013.01); *H01L 2224/48247* (2013.01); *H01L 2224/48472* (2013.01); *H01L 2924/1305* (2013.01); *H01L 2924/13055* (2013.01)

(58) Field of Classification Search
  CPC ............... H01L 23/50; H01L 2924/19041; H01L 2924/3011; H01L 21/761; H01L 29/00
  USPC .......... 327/512, 513, 108, 109, 537, 564–566
  See application file for complete search history.

(56) References Cited

U.S. PATENT DOCUMENTS

| | | | |
|---|---|---|---|
| 2002/0030532 A1* | 3/2002 | Majumdar et al. ............ | 327/427 |
| 2005/0099751 A1* | 5/2005 | Kumagai ...................... | 361/100 |
| 2006/0022355 A1 | 2/2006 | Murai et al. | |
| 2006/0244116 A1* | 11/2006 | Tsunoda ....................... | 257/678 |
| 2007/0284664 A1* | 12/2007 | Okuda et al. .................. | 257/355 |
| 2008/0140351 A1* | 6/2008 | Kerkman et al. ............. | 702/182 |
| 2009/0283765 A1 | 11/2009 | Onishi et al. | |
| 2010/0320951 A1* | 12/2010 | Hasegawa et al. ............ | 318/434 |
| 2012/0250385 A1* | 10/2012 | Takihara et al. .............. | 363/132 |

FOREIGN PATENT DOCUMENTS

| | | |
|---|---|---|
| JP | 2004-273749 A | 9/2004 |
| JP | 2006-066895 A | 3/2006 |
| JP | 2006-324595 A | 11/2006 |
| JP | 2009-277787 A | 11/2009 |
| JP | 2011-243626 A | 12/2011 |
| JP | 2011-249364 A | 12/2011 |
| JP | 2012-064677 A | 3/2012 |
| JP | 2012-142351 A | 7/2012 |

OTHER PUBLICATIONS

An Office Action; "Notice of Reasons for Refusal," issued by the Japanese Patent Office o Jun. 16, 2015, which corresponds to Japanese Patent Application No. 2012-172464 and is related to U.S. Appl. No. 13/829,418; with English language translation.

* cited by examiner

*Primary Examiner* — Quan Tra
(74) *Attorney, Agent, or Firm* — Studebaker & Brackett PC

(57) ABSTRACT

A power semiconductor device module includes a plurality of inverters, each having a first transistor and a second transistor that are interposed in series between a first potential and a second potential and that operate complementarily. The plurality of inverters are assembled into a module. Only one predetermined inverter of the plurality of inverters is configured to detect temperatures of the first and second transistors, and control terminals for detection of the temperatures of the first and second transistors protrude from sides of the module.

5 Claims, 9 Drawing Sheets

F I G . 2
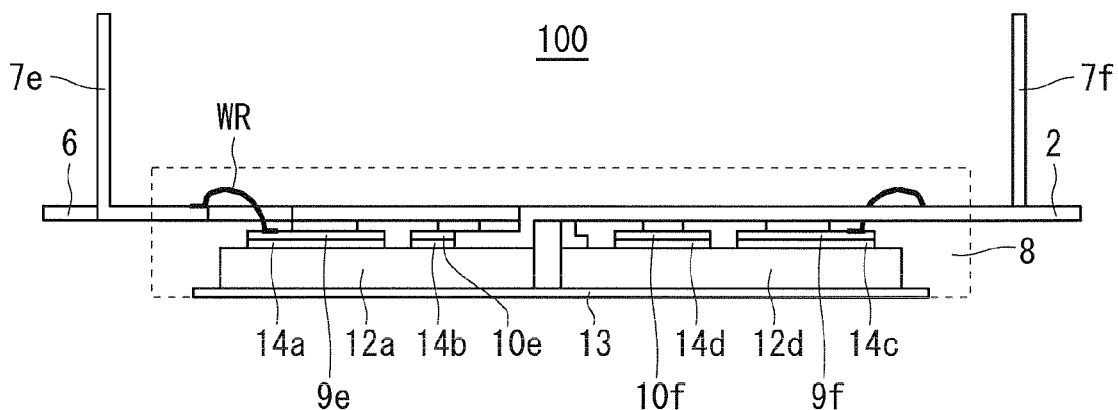

F I G . 1 0
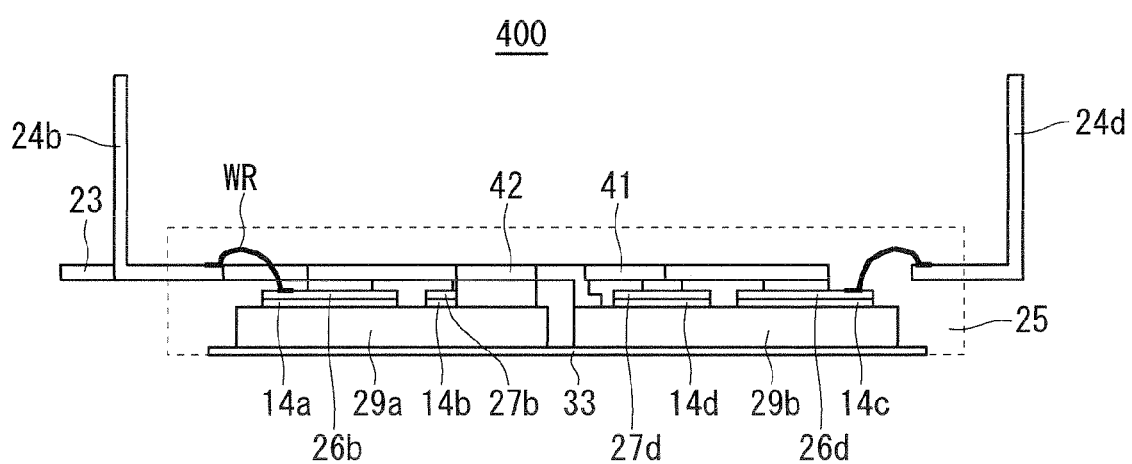

POWER SEMICONDUCTOR DEVICE MODULE

BACKGROUND OF THE INVENTION

1. Field of the Invention

The present invention relates to a power semiconductor device module having mounted thereon a voltage drive type semiconductor device such as IGBT (Insulated Gate Bipolar Transistor).

2. Description of the Background Art

In a power semiconductor device module, an electrical wiring connected to a semiconductor device mounted on the module is generally made from copper or the like which has a low electrical resistance and is inexpensive. The current density is designed such that heat generation upon passage of current does not exceed the heat-resistant temperature of the semiconductor device and the members composing the power semiconductor device module.

Meanwhile, miniaturization of the power semiconductor device module has been advanced year by year due to a reduction in the loss of semiconductor device mounted on the module and improvements in cooling performance and insulation performance. Along with this, implementation of integration where the module includes a plurality of semiconductor devices and implementation of intelligence where the module has the function of protecting the semiconductor device from overcurrent and overheat have also been advanced.

Hence, the number of external terminals of the power semiconductor device module has significantly increased, and miniaturization of principal current wiring has reached a limit. Thus, to advance miniaturization of the power semiconductor device module, there is a need to eliminate wasted space as much as possible to place electrical wiring. In particular, since the external terminals connected to external wiring are exposed to air, insulation distance needs to be secured from the electrical wiring within the power semiconductor device module which is covered with an insulating material. Thus, to miniaturize the power semiconductor device module, there is a need to reduce the number of external terminals as much as possible and thoroughly consider an exposure location.

For a conventional technique for an integrated power semiconductor device module, there is, for example, as disclosed in FIG. 11 of Japanese Patent Application Laid-Open No. 2011-249364, a power semiconductor device module of a 6-in-1 structure where six semiconductor devices are assembled into a module.

The power semiconductor device module described in Japanese Patent Application Laid-Open No. 2011-249364 adopts a configuration in which five control terminals are pulled out of each of the six semiconductor devices through bonding wires. The five control terminals generally include a gate terminal that controls the passage of current of the semiconductor device; an emitter sense terminal; a current sense terminal for protecting the semiconductor device from overcurrent; and anode and cathode terminals of a temperature sense diode for protecting the semiconductor device from overheat. Hence, the power semiconductor device module described in Japanese Patent Application Laid-Open No. 2011-249364 has difficulty in miniaturization due to a large number of control terminals.

In addition, there is a problem that wiring inductance is large, since wiring on the direct-current high-voltage side and wiring on the direct-current low-voltage side are provided at distant locations.

SUMMARY OF THE INVENTION

An object of the present invention is to miniaturize a power semiconductor device module by reducing the number of external terminals as much as possible, and to reduce wiring inductance.

According to one aspect of the present invention, there is provided a power semiconductor device module including a plurality of inverters, each having a first transistor and a second transistor, the first and second transistors being interposed in series between a first potential and a second potential and operating complementarily, and the plurality of inverters being assembled into a module, in which only one predetermined inverter of the plurality of inverters is configured to detect temperatures of the first and second transistors, and control terminals for detection of the temperatures of the first and second transistors protrude from sides of the module.

According to the power semiconductor device module, since the number of control terminals for temperature detection can be reduced, the power semiconductor device module can be miniaturized.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a side view showing a configuration of the power semiconductor device module of the first preferred embodiment according to the present invention;

FIG. 10 is a side view showing a configuration of the power semiconductor device module of the fourth preferred embodiment according to the present invention.

DESCRIPTION OF THE PREFERRED EMBODIMENTS

First Preferred Embodiment

Figure 1:
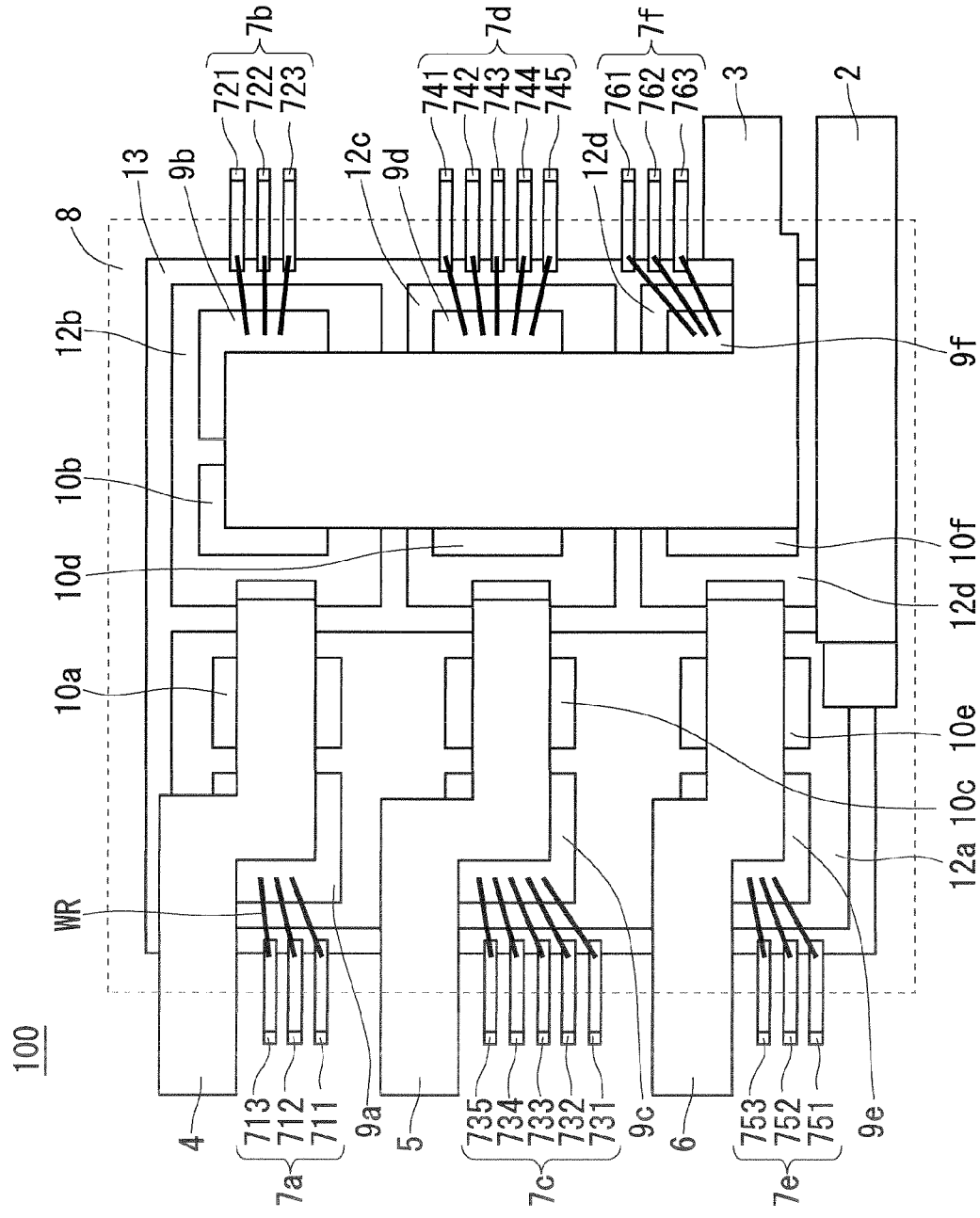
FIG. 1 is a plan view showing a configuration of a power semiconductor device module of a first preferred embodiment according to the present invention.
Figure 3:
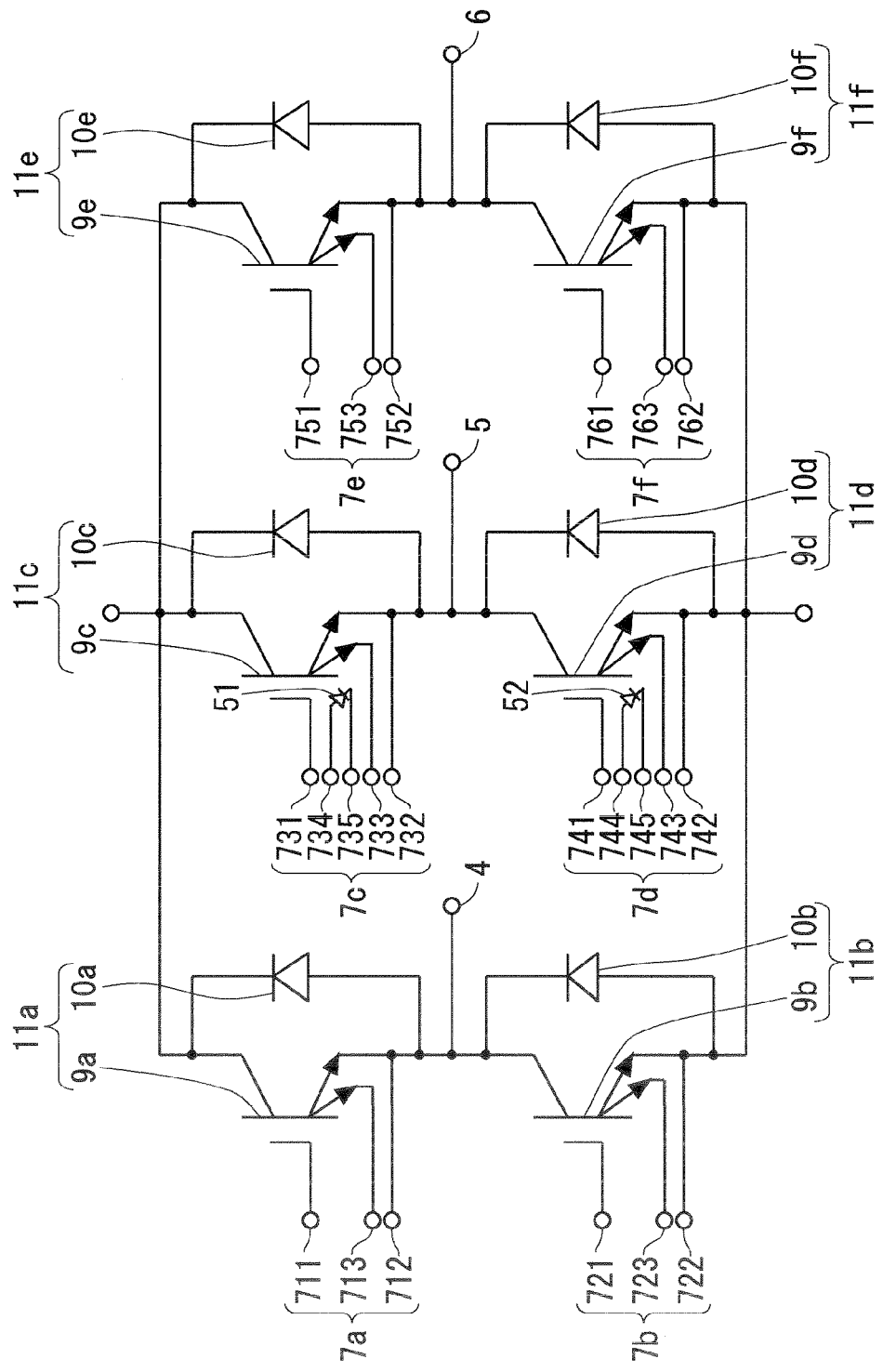
FIG. 3 is a circuit diagram showing a configuration of the power semiconductor device module of the first preferred embodiment according to the present invention.

FIG. 1 is a plan view showing a configuration of a power semiconductor device module 100 of a first preferred embodiment according to the present invention, and FIG. 2 is a side view as viewed from the side of a direct-current high-voltage terminal 2. In both drawings, a mold resin 8 is omitted. FIG. 3 is a circuit diagram showing a configuration of the power semiconductor device module 100.

As shown in FIG. 3, the power semiconductor device module 100 includes six semiconductor chip groups 11a, 11b, 11c, 11d, 11e, and 11f including IGBT chips 9a, 9b, 9c, 9d, 9e, and 9f having a temperature detection function; and diode chips 10a, 10b, 10c, 10d, 10e, and 10f which are connected in anti-parallel with the IGBT chips 9a to 9f, respectively.

The semiconductor chip groups 11a and 11b in a set, the semiconductor chip groups 11c and 11d in a set, and the semiconductor chip groups 11e and 11f in a set each are connected in series with each other, and output terminals 4, 5, and 6 are connected to the respective connection nodes.

The collector sides of the IGBT chips 9a, 9c, and 9e (the cathode sides of the diode chips 10a, 10c, and 10e) included in the semiconductor chip groups 11a, 11c, and 11e are connected in parallel with one another, and the direct-current high-voltage terminal 2 is connected to the connection node therebetween.

The emitter sides of the IGBT chips 9b, 9d, and 9f (the anode sides of the diode chips 10b, 10d, and 10f) included in the semiconductor chip groups 11b, 11d, and 11f are connected in parallel with one another, and a direct-current low-voltage terminal 3 is connected to the connection node therebetween.

Control terminal groups 7a, 7b, 7c, 7d, 7e, and 7f are connected to the IGBT chips 9a to 9f, respectively.

By the above-described configuration, it can be said that the semiconductor chip groups 11a and 11b are a single inverter composed of transistors and free wheeling diodes which are inserted in series between the direct-current high-voltage terminal 2 (which provides a first potential) and the direct-current low-voltage terminal 3 (which provides a second potential) and which operate complementarily.

In addition, the semiconductor chip groups 11c and 11d can be said to be a single inverter composed of transistors and free wheeling diodes which are inserted in series between the direct-current high-voltage terminal 2 and the direct-current low-voltage terminal 3 and which operate complementarily.

In addition, the semiconductor chip groups 11e and 11f can be said to be a single inverter composed of transistors and free wheeling diodes which are inserted in series between the direct-current high-voltage terminal 2 and the direct-current low-voltage terminal 3 and which operate complementarily.

The control terminal group 7a includes a gate terminal 711 that applies a gate voltage for driving the IGBT chip 9a; an emitter sense terminal 712 that detects an output from an emitter; and a current sense terminal 713 for detecting a principal current of the IGBT chip 9a.

The control terminal group 7b includes a gate terminal 721 that applies a gate voltage for driving the IGBT chip 9b; an emitter sense terminal 722 that detects an output from an emitter; and a current sense terminal 723 for detecting a principal current of the IGBT chip 9b.

The control terminal group 7c includes a gate terminal 731 that applies a gate voltage for driving the IGBT chip 9c; an emitter sense terminal 732 that detects an output from an emitter; a current sense terminal 733 for detecting a principal current of the IGBT chip 9c; and an anode terminal 734 and a cathode terminal 735 of a temperature sense diode 51 for detecting a temperature of the IGBT chip 9c.

The control terminal group 7d includes a gate terminal 741 that applies a gate voltage for driving the IGBT chip 9d; an emitter sense terminal 742 that detects an output from an emitter; a current sense terminal 743 for detecting a principal current of the IGBT chip 9d; and an anode terminal 744 and a cathode terminal 745 of a temperature sense diode 52 for detecting a temperature of the IGBT chip 9d.

Note that the temperature sense diodes 51 and 52 are provided within the IGBT chips 9c and 9d, respectively, and only anode pads and cathode pads are exposed to the top surfaces of the IGBT chips. Note also that although other IGBT chips also include temperature sense diodes, since, as will be described later, other IGBT chips do not use the temperature sense diodes, the temperature sense diodes are not shown in FIG. 3.

The control terminal group 7e includes a gate terminal 751 that applies a gate voltage for driving the IGBT chip 9e; an emitter sense terminal 752 that detects an output from an emitter; and a current sense terminal 753 for detecting a principal current of the IGBT chip 9e.

The control terminal group 7f includes a gate terminal 761 that applies a gate voltage for driving the IGBT chip 9f; an emitter sense terminal 762 that detects an output from an emitter; and a current sense terminal 763 for detecting a principal current of the IGBT chip 9f.

As shown in FIGS. 1 and 2, the gate terminals 711, 721, 731, 741, 751, and 761 are electrically connected to gate pads (not shown) of the IGBT chips 9a to 9f, respectively, through wires WR such as aluminum, and the emitter sense terminals 712, 722, 732, 742, 752, and 762 are electrically connected to emitter electrodes (not shown) of the IGBT chips 9a to 9f, respectively, through wires WR such as aluminum.

In addition, the current sense terminals 713, 723, 733, 743, 753, and 763 are electrically connected to current sense pads (not shown) of the IGBT chips 9a to 9f, respectively, through wires WR such as aluminum.

The anode terminal 734 and the cathode terminal 735 are electrically connected to an anode pad (not shown) and a cathode pad (not shown) of the temperature sense diode 51, respectively, through wires WR such as aluminum, and the anode terminal 744 and the cathode terminal 745 are electrically connected to an anode pad (not shown) and a cathode pad (not shown) of the temperature sense diode 52, respectively, through wires WR such as aluminum.

As such, the power semiconductor device module 100 is configured as a three-phase inverter circuit, and includes control terminals for detecting currents and temperatures to protect the IGBT chips from overcurrent and overheat.

As shown in FIG. 1, the IGBT chips 9a, 9c, and 9e and the diode chips 10a, 10c, and 10e which serve as the high-voltage side are provided on an electrode pattern 12a such that the IGBT chips 9a, 9c, and 9e are provided in a line in this order and the diode chips 10a, 10c, and 10e are provided in a line in this order in parallel with the IGBT chips 9a, 9c, and 9e. Note that the IGBT chips 9a, 9c, and 9e are arranged at a location near the outer side of the power semiconductor device module 100, and the diode chips 10a, 10c, and 10e are arranged at a location near the center of the power semiconductor device module 100.

Note that, as shown in FIG. 2, the IGBT chip 9e and the diode chip 10e are mounted on the electrode pattern 12a with solder layers 14a and 14b respectively provided therebetween, and the same applies to the IGBT chips 9a and 9c and the diode chips 10a and 10c.

The IGBT chip 9b and the diode chip 10b which serve as the low-voltage side are provided in parallel with each other on an electrode pattern 12b. On the electrode pattern 12b, the diode chip 10b is arranged at a location near the center of the power semiconductor device module 100, and the IGBT chip 9b is arranged at a location near the outer side of the power semiconductor device module 100.

The IGBT chip 9d and the diode chip 10d which serve as the low-voltage side are provided in parallel with each other on an electrode pattern 12c. On the electrode pattern 12c, the diode chip 10d is arranged at a location near the center of the power semiconductor device module 100, and the IGBT chip 9d is arranged at a location near the outer side of the power semiconductor device module 100.

The IGBT chip 9f and the diode chip 10f which serve as the low-voltage side are provided in parallel with each other on an electrode pattern 12d. On the electrode pattern 12d, the diode chip 10f is arranged at a location near the center of the power semiconductor device module 100, and the IGBT chip 9f is arranged at a location near the outer side of the power semiconductor device module 100.

Note that, as shown in FIG. 2, the IGBT chip 9f and the diode chip 10f are mounted on the electrode pattern 12d with solder layers 14c and 14d respectively provided therebetween, and the same applies to the IGBT chips 9b and 9d and the diode chips 10b and 10d except that the electrode patterns to which they are mounted are different from the electrode pattern 12d.

Note that the electrode patterns 12a to 12d are formed of a metal such as copper, and are arranged on an insulating substrate 13 formed of a filler-filled epoxy resin, ceramic, etc., and the electrode patterns 12b to 12d are provided in a line in the order of the electrode patterns 12b to 12d so as to be adjacent to the electrode pattern 12a.

As described above, since the IGBT chip 9c is sandwiched between the IGBT chips 9a and 9e, the IGBT chip 9c has a lower cooling capability than the IGBT chips 9a and 9e and thus there is a possibility that the temperature of the IGBT chip 9c becomes higher than those of the IGBT chips 9a and 9e due to heat generation caused by passage of current. Likewise, since the IGBT chip 9d is sandwiched between the IGBT chips 9b and 9f, the IGBT chip 9d has a lower cooling capability than the IGBT chips 9b and 9f and thus there is a possibility that the temperature of the IGBT chip 9d becomes higher than those of the IGBT chips 9b and 9f due to heat generation caused by passage of current.

Therefore, locations where temperature is monitored for overheat protection operation of the IGBT chips are only the IGBT chips 9c and 9d which have the highest possibility of increasing in temperature.

One end of each of the output terminals 4 to 6 and one end of each of the control terminal groups 7a, 7c, and 7e of the respective IGBT chips 9a, 9c, and 9e protrude in the same direction outwardly from one side of the mold resin 8 whose top-view shape is rectangular. The output terminal 4 and the control terminal group 7a, the output terminal 5 and the control terminal group 7c, and the output terminal 6 and the control terminal group 7e protrude outwardly so as to be close to each other.

Note that the one end of the output terminal 4 is connected to an emitter pad (not shown) and an anode pad (not shown) on the top surfaces of the respective IGBT chip 9a and the diode chip 10a, and the other end is connected to the electrode pattern 12b.

The one end of the output terminal 5 is connected to an emitter pad (not shown) and an anode pad (not shown) on the top surfaces of the respective IGBT chip 9c and the diode chip 10c, and the other end is connected to the electrode pattern 12c.

The one end of the output terminal 6 is connected to an emitter pad (not shown) and an anode pad (not shown) on the top surfaces of the respective IGBT chip 9e and the diode chip 10e, and the other end is connected to the electrode pattern 12d.

One end of the direct-current high-voltage terminal 2 is connected to a portion of the electrode pattern 12a adjacent to the diode chip 10e, and the other end protrudes outwardly from a side of the mold resin 8 that is on the opposite side from the direction in which the output terminals 4 to 6 and the control terminal groups 7a, 7c, and 7e protrude.

On the other hand, the direct-current low-voltage terminal 3 is connected in a shared manner to emitter pads (not shown) on the top surfaces of the respective IGBT chips 9b, 9d, and 9f and to anode pads (not shown) on the top surfaces of the respective diode chips 10b, 10d, and 10f. One end of the direct-current low-voltage terminal 3 and one end of each of the control terminal groups 7b, 7d, and 7f of the respective IGBT chips 9b, 9d, and 9f protrude in the same direction outwardly from the side that is on the opposite side from the direction in which the output terminals 4 to 6 and the control terminal groups 7a, 7c, and 7e protrude. Note that the one end of the direct-current low-voltage terminal 3 protrudes from a location adjacent to the control terminal group 7f, and the other end of the direct-current high-voltage terminal 2 protrudes so as to be adjacent to the direct-current low-voltage terminal 3 on the side opposite to the control terminal group 7f.

In the power semiconductor device module 100 described above, a voltage applied between a gate pad, a current sense pad, the anode and cathode pads of a temperature sense diode, and an emitter electrode is very small and is on the order of 15 to 20 V at the maximum. Hence, the insulation distance between the control terminals in the control terminal groups 7a to 7f connected to those pads and the electrode can be reduced and thus the control terminals can be disposed so as to be close to each other.

In addition, the output terminal 4 corresponds to the emitter electrode of the IGBT chip 9a, the output terminal 5 corresponds to the emitter electrode of the IGBT chip 9c, and the output terminal 6 corresponds to the emitter electrode of the IGBT chip 9e. Hence, since voltages applied between the output terminal 4 and the control terminal group 7a of the IGBT chip 9a, between the output terminal 5 and the control terminal group 7c of the IGBT chip 9c, and between the output terminal 6 and the control terminal group 7e of the IGBT chip 9e are also very small, the insulation distance therebetween can be reduced and thus they can be disposed so as to be close to each other.

In addition, since the direct-current low-voltage terminal 3 corresponds to the emitter electrodes of the IGBT chips 9b, 9d, and 9f, a voltage applied between the direct-current low-voltage terminal 3 and the control terminal groups 7b, 7d, and 7f of the IGBT chips 9b, 9d, and 9f is also very small. Hence, the insulation distance therebetween can be reduced and thus they can be disposed so as to be close to each other. In addition, since a voltage applied between the control terminal groups 7b, 7d, and 7f is also very small, the insulation distance therebetween can be reduced and thus they can be disposed so as to be close to each other.

By thus using the temperature sense diodes 51 and 52 only in the IGBT chips 9c and 9d which have the highest possibility of increasing in temperature, and connecting the anode terminal 734 and the cathode terminal 735 to the temperature sense diode 51 and connecting the anode terminal 744 and the cathode terminal 745 to the temperature sense diode 52, temperature control can be performed, and the power semiconductor device module 100 can be miniaturized by reducing the number of control terminals.

In addition, by allowing the direct-current high-voltage terminal 2 and the direct-current low-voltage terminal 3 to protrude outwardly so as to be adjacent and close to each other, the wiring inductance between the direct-current high-voltage terminal 2 and the direct-current low-voltage terminal 3 can be reduced.

Second Preferred Embodiment

Figure 4:
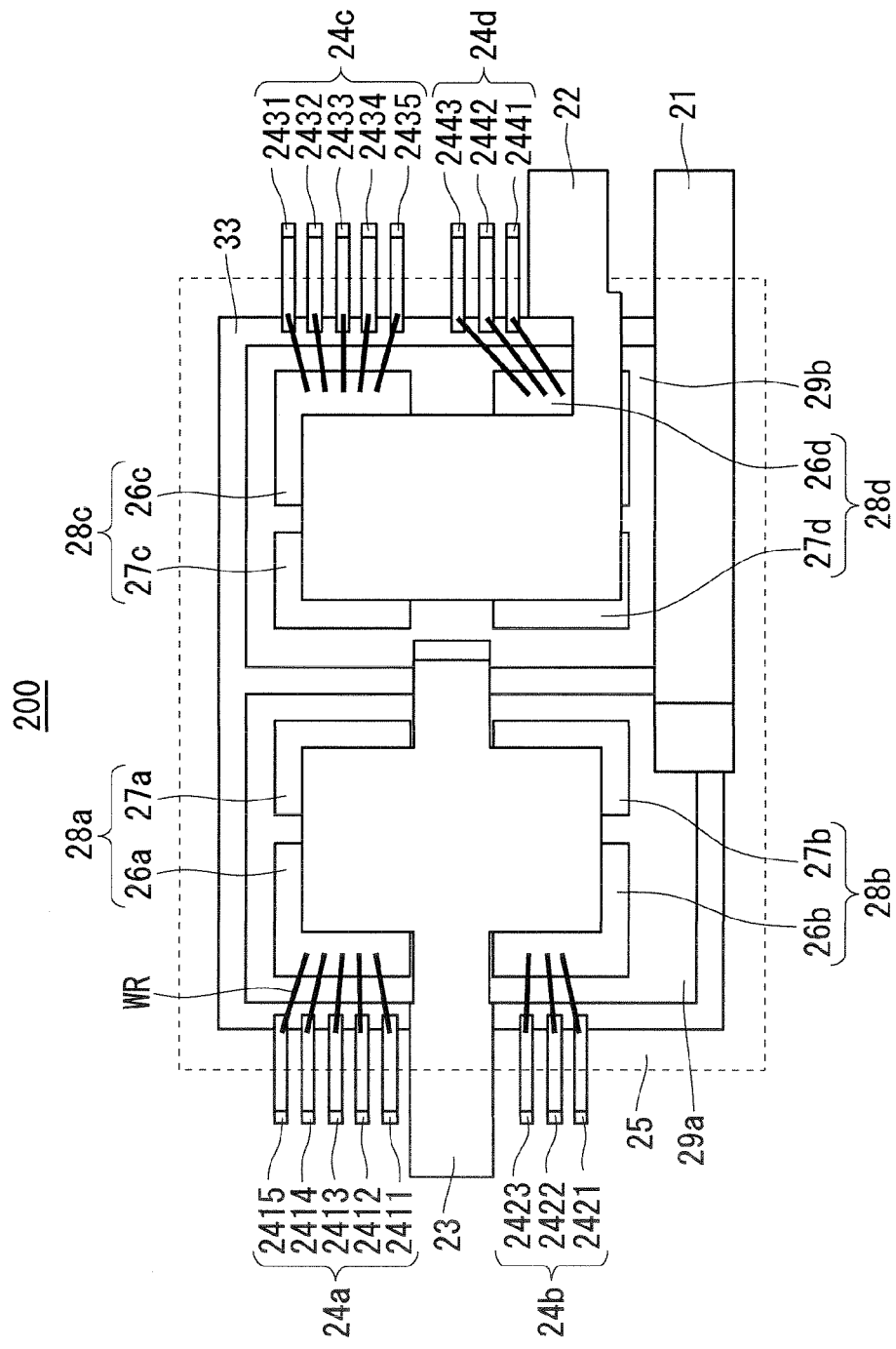
FIG. 4 is a plan view showing a configuration of a power semiconductor device module of a second preferred embodiment according to the present invention.
Figure 5:
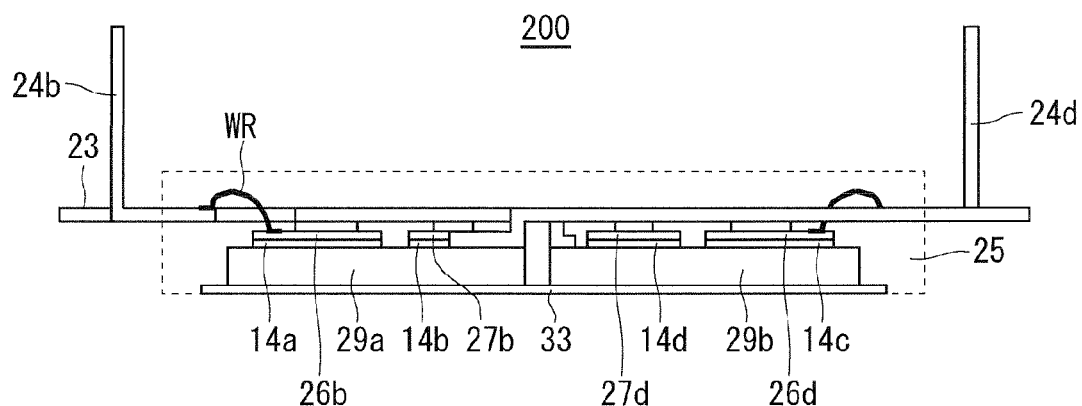
FIG. 5 is a side view showing a configuration of the power semiconductor device module of the second preferred embodiment according to the present invention.
Figure 6:
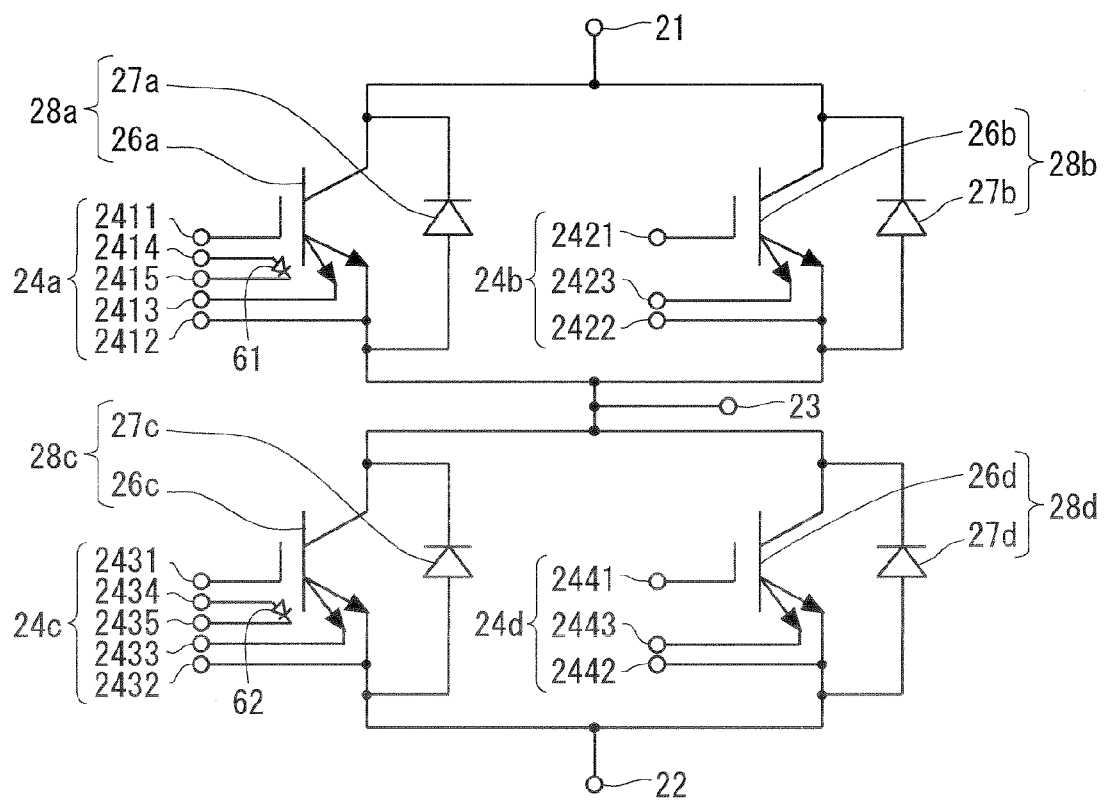
FIG. 6 is a circuit diagram showing a configuration of the power semiconductor device module of the second preferred embodiment according to the present invention.

FIG. 4 is a plan view showing a configuration of a power semiconductor device module 200 of a second preferred embodiment according to the present invention, and FIG. 5 is a side view as viewed from the side of a direct-current high-voltage terminal 21. In both drawings, a mold resin 25 is omitted. FIG. 6 is a circuit diagram showing a configuration of the power semiconductor device module 200.

As shown in FIG. 6, the power semiconductor device module 200 includes four semiconductor chip groups 28a, 28b, 28c, and 28d including IGBT chips 26a, 26b, 26c, and 26d having a temperature detection function; and diode chips 27a, 27b, 27c, and 27d which are connected in anti-parallel with the IGBT chips 26a to 26d, respectively.

The semiconductor chip groups 28a and 28b in a set and the semiconductor chip groups 28c and 28d in a set each are connected in parallel with each other, and the set of the semiconductor chip groups 28a and 28b and the set of the semiconductor chip groups 28c and 28d are connected in series with each other.

An output terminal 23 is connected to a connection node where the sets of semiconductor chip groups are connected in series with each other. The direct-current high-voltage terminal 21 is connected to a connection node between the collector sides of the IGBT chips 26a and 26b (the cathode sides of the diode chips 27a and 27b) included in the semiconductor chip groups 28a and 28b.

A direct-current low-voltage terminal 22 is connected to a connection node between the emitter sides of the IGBT chips 26c and 26d (the anode sides of the diode chips 27c and 27d) included in the semiconductor chip groups 28c and 28d.

With the above-described configuration, it can be said that the semiconductor chip groups 28a and 28c are a single inverter composed of transistors and free wheeling diodes which are inserted in series between the direct-current high-voltage terminal 21 (which provides a first potential) and the direct-current low-voltage terminal 22 (which provides a second potential) and which operate complementarily, and it can be said that the semiconductor chip groups 28b and 28d are a single inverter composed of transistors and free wheeling diodes which are inserted in series between the direct-current high-voltage terminal 21 and the direct-current low-voltage terminal 22 and which operate complementarily.

The two inverters share a common output terminal, and the IGBT chips 26a and 26b in a set included in the semiconductor chip groups 28a and 28b operate in a common manner, the IGBT chips 26c and 26d in a set included in the semiconductor chip groups 28c and 28d operate in a common manner, and the set of the IGBT chips 26a and 26b and the set of the IGBT chips 26c and 26d operate complementarily, whereby a half-bridge circuit is formed.

In addition, control terminal groups 24a, 24b, 24c, and 24d are connected to the IGBT chips 26a to 26d, respectively.

The control terminal group 24a includes a gate terminal 2411 that applies a gate voltage for driving the IGBT chip 26a; an emitter sense terminal 2412 that detects an output from an emitter; a current sense terminal 2413 for detecting a principal current of the IGBT chip 26a; and an anode terminal 2414 and a cathode terminal 2415 of a temperature sense diode 61 for detecting a temperature of the IGBT chip 26a.

The control terminal group 24b includes a gate terminal 2421 that applies a gate voltage for driving the IGBT chip 26b; an emitter sense terminal 2422 that detects an output from an emitter; and a current sense terminal 2423 for detecting a principal current of the IGBT chip 26b.

The control terminal group 24c includes a gate terminal 2431 that applies a gate voltage for driving the IGBT chip 26c; an emitter sense terminal 2432 that detects an output from an emitter; a current sense terminal 2433 for detecting a principal current of the IGBT chip 26c; and an anode terminal 2434 and a cathode terminal 2435 of a temperature sense diode 62 for detecting a temperature of the IGBT chip 26c.

The control terminal group 24d includes a gate terminal 2441 that applies a gate voltage for driving the IGBT chip 26d; an emitter sense terminal 2442 that detects an output from an emitter; and a current sense terminal 2443 for detecting a principal current of the IGBT chip 26d.

As shown in FIGS. 4 and 5, the gate terminals 2411, 2421, 2431, and 2441 are electrically connected to gate pads (not shown) of the IGBT chips 26a to 26d, respectively, through wires WR such as aluminum, and the emitter sense terminals 2412, 2422, 2432, and 2442 are electrically connected to emitter electrodes (not shown) of the IGBT chips 26a to 26d, respectively, through wires WR such as aluminum.

In addition, the current sense terminals 2413, 2423, 2433, and 2443 are electrically connected to current sense pads (not shown) of the IGBT chips 26a to 26d, respectively, through wires WR such as aluminum.

The anode terminal 2414 and the cathode terminal 2415 are electrically connected to an anode pad (not shown) and a cathode pad (not shown) of the temperature sense diode 61, respectively, through wires WR such as aluminum, and the anode terminal 2434 and the cathode terminal 2435 are electrically connected to an anode pad (not shown) and a cathode pad (not shown) of the temperature sense diode 62, respectively, through wires WR such as aluminum.

As such, the power semiconductor device module 200 forms a half-bridge circuit in which two semiconductor chip groups are connected in parallel with each other, and includes control terminals for detecting currents and temperatures to protect the IGBT chips from overcurrent and overheat.

As shown in FIG. 4, the IGBT chips 26a and 26b and the diode chips 27a and 27b which serve as the high-voltage side are provided on an electrode pattern 29a in a line in the order of the IGBT chips 26a and 26b, and the diode chips 27a and 27b are provided in a line in this order in parallel with the IGBT chips 26a and 26b. Note that one end of the direct-current high-voltage terminal 21 is connected to a portion of the electrode pattern 29a adjacent to the diode chip 27b, and the other end protrudes from a side of the mold resin 25 so as to pass through over an edge portion of an electrode pattern 29b on the side of the IGBT chip 26d and the diode chip 27d.

Note that, as shown in FIG. 5, the IGBT chip 26b and the diode chip 27b are mounted on the electrode pattern 29a with solder layers 14a and 14b respectively provided therebetween, and the same applies to the IGBT chip 26a and the diode chip 27a.

Note also that the IGBT chip 26d and the diode chip 27d are mounted on the electrode pattern 29b with solder layers 14c and 14d respectively provided therebetween, and the same applies to the IGBT chip 26c and the diode chip 27c.

The electrode patterns 29a and 29b are formed of a metal such as copper, and are arranged on an insulating substrate 33 formed of a filler-filled epoxy resin, ceramic, etc.

The IGBT chips 26a and 26b and the diode chips 27a and 27b are connected to a location shifted in an upper direction from the center of the electrode pattern 29a in order to secure the location of connection of the direct-current high-voltage terminal 21 to the electrode pattern 29a. Hence, the IGBT chip 26a connected to a location closer to an edge of the electrode pattern 29a has a lower cooling capability than the IGBT chip 26b and thus there is a possibility that the temperature of the IGBT chip 26a becomes higher than that of the IGBT chip 26b due to heat generation caused by passage of current. This is due to the fact that since the IGBT chip 26a is located near the edge of the electrode pattern 29a, the heating surface area is reduced.

The IGBT chips 26c and 26d and the diode chips 27c and 27d which serve as the low-voltage side are provided on the electrode pattern 29b which is provided in parallel with the electrode pattern 29a, such that the IGBT chips 26c and 26d are provided in a line in this order and the diode chips 27c and 27d are provided in a line in this order in parallel with the IGBT chips 26c and 26d.

Note that the IGBT chips 26c and 26d and the diode chips 27c and 27d are also connected to a location shifted in an upper direction from the center of the electrode pattern 29b in order to secure a route where the direct-current high-voltage terminal 21 is provided. Hence, the IGBT chip 26c connected to a location closer to an edge of the electrode pattern 29b has a lower cooling capability than the IGBT chip 26d and thus there is a possibility that the temperature of the IGBT chip 26c becomes higher than that of the IGBT chip 26d due to heat generation caused by passage of current. This is due to the fact that since the IGBT chip 26c is located near the edge of the electrode pattern 29b, the heating surface area is reduced.

Therefore, locations where temperature is monitored for overheat protection operation of the IGBT chips are only the IGBT chips 26a and 26c which have the highest possibility of increasing in temperature.

One end of the output terminal 23 and one end of each of the control terminal groups 24a and 24b of the respective IGBT chips 26a and 26b protrude in the same direction outwardly from one side of the mold resin 25 whose top-view shape is rectangular. Note that the output terminal 23 and the control terminal groups 24a and 24b protrude outwardly so as to be close to each other.

Note that the one end of the output terminal 23 is connected in a shared manner to emitter pads (not shown) and anode pads (not shown) on the top surfaces of the respective IGBT chips 26a and 26b and the respective diode chips 27a and 27b, and the other end is connected to the electrode pattern 29b.

On the other hand, one end of the direct-current low-voltage terminal 22 is connected in a shared manner to emitter pads (not shown) and anode pads (not shown) on the top surfaces of the respective IGBT chips 26c and 26d and the respective diode chips 27c and 27d, and the other end together with the control terminal groups 24c and 24d of the IGBT chips 26c and 26d protrudes in the same direction outwardly from a side of the mold resin 25 that is on the opposite side from the direction in which the output terminal 23 and the control terminal groups 24a and 24b protrude, such that the other end and the control terminal groups 24c and 24d are close to one another.

Note that the other end of the direct-current low-voltage terminal 22 protrudes from a location adjacent to the control terminal group 24d, and the other end of the direct-current high-voltage terminal 21 protrudes so as to be adjacent to the direct-current low-voltage terminal 22 on the side opposite to the control terminal group 24d.

In the power semiconductor device module 200 described above, by using the temperature sense diodes 61 and 62 only in the IGBT chips 26a and 26c which have the highest possibility of increasing in temperatures, and connecting the anode terminal 2414 and the cathode terminal 2415 to the temperature sense diode 61 and connecting the anode terminal 2434 and the cathode terminal 2435 to the temperature sense diode 62, temperature control can be performed, and the power semiconductor device module 200 can be miniaturized by reducing the number of control terminals.

In addition, by allowing the direct-current high-voltage terminal 21 and the direct-current low-voltage terminal 22 to protrude outwardly so as to be adjacent and close to each other, the wiring inductance between the direct-current high-voltage terminal 21 and the direct-current low-voltage terminal 22 can be reduced.

Third Preferred Embodiment

Figure 7:
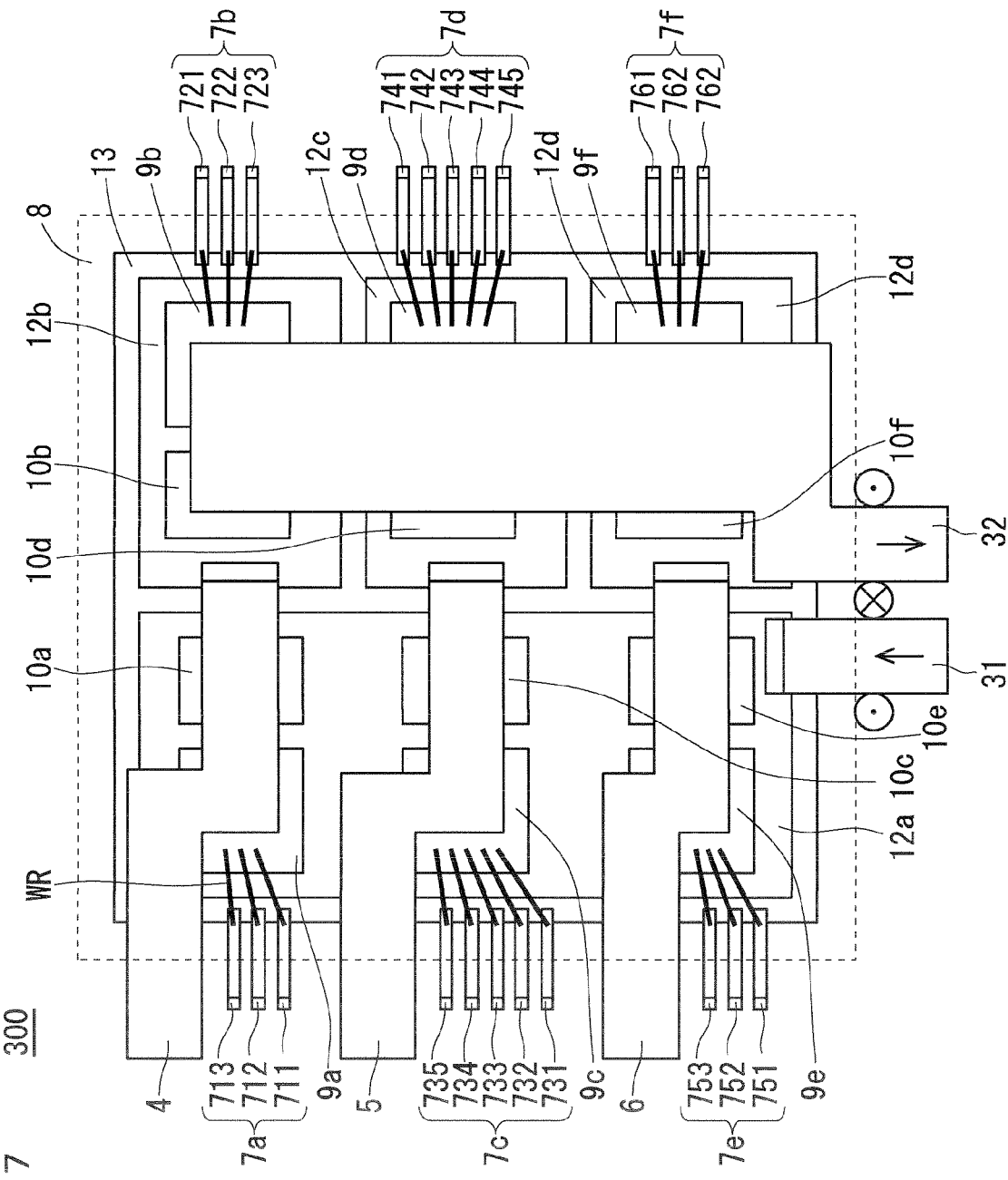
FIG. 7 is a plan view showing a configuration of a power semiconductor device module of a third preferred embodiment according to the present invention.
Figure 8:
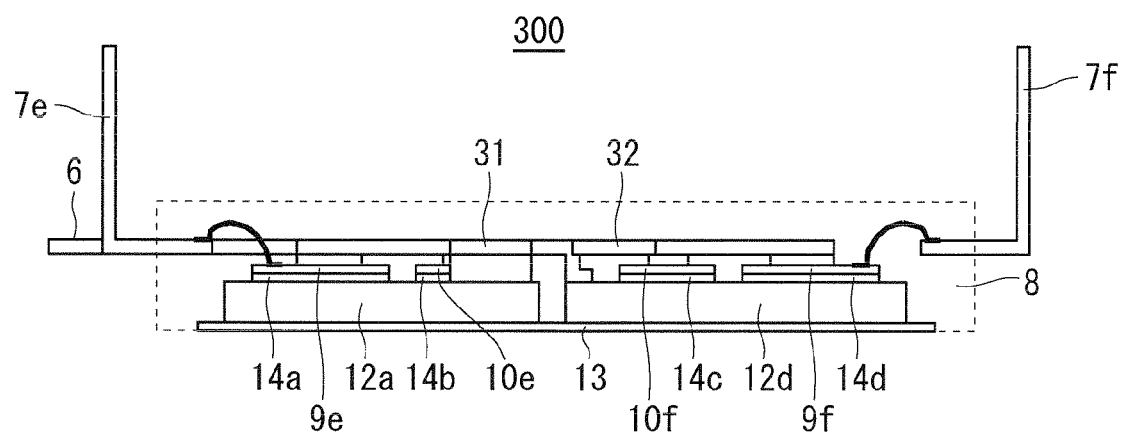
FIG. 8 is a side view showing a configuration of the power semiconductor device module of the third preferred embodiment according to the present invention.

FIG. 7 is a plan view showing a configuration of a power semiconductor device module 300 of a third preferred embodiment according to the present invention, and FIG. 8 is a side view as viewed from the side of a direct-current high-voltage terminal 31 and a direct-current low-voltage terminal 32. In both drawings, a mold resin 8 is omitted.

Note that the power semiconductor device module 300 has the same circuit configuration as the power semiconductor device module 100 of the first preferred embodiment, and is configured as a three-phase inverter circuit and includes control terminals having functions for detecting currents and temperatures to protect IGBT chips from overcurrent and overheat. Note that the same components as those of the power semiconductor device module 100 shown in FIGS. 1 and 2 are denoted by the same reference characters and overlapping description is omitted.

As shown in FIG. 7, in the power semiconductor device module 300, the direct-current high-voltage terminal 31 and the direct-current low-voltage terminal 32 are provided instead of the direct-current high-voltage terminal 2 and the direct-current low-voltage terminal 3, and the direct-current high-voltage terminal 31 and the direct-current low-voltage terminal 32 are configured to protrude outwardly from a side of the mold resin 8 in a direction differing by 90 degrees from sides of the mold resin 8 from which control terminal groups 7a to 7f protrude outwardly.

Namely, one end of the direct-current high-voltage terminal 31 is connected to a portion of an electrode pattern 12a adjacent to a diode chip 10e, and the other end protrudes from a side of the mold resin 8 closest thereto. One end of the direct-current low-voltage terminal 32 protrudes from the side of the mold resin 8 from which the direct-current high-voltage terminal 31 protrudes, so as to be adjacent and close to the direct-current high-voltage terminal 31.

In general, in a power semiconductor device module for a three-phase inverter, a direct-current voltage source is connected to a direct-current high-voltage terminal and a direct-current low-voltage terminal, and a load such as a three-phase motor is connected to three-phase output terminals. With such a configuration, by repetition of switching operation (ON/OFF operation) of IGBT chips 9a to 9f and diode chips 10a to 10f, three-phase alternating currents are supplied to the load.

Due to the change in current with time (di/dt) caused by the switching operation, there is a possibility that an induced electromotive force caused by electromagnetic induction may be generated in a neighboring electric circuit. If such an induced electromotive force is superimposed on a gate drive circuit of an IGBT chip or a signal circuit of a temperature sensor, etc., then there is a possibility that stable switching operation or secure protection operation may be affected.

In the power semiconductor device module 300, since the direct-current high-voltage terminal 31 and the direct-current low-voltage terminal 32 protrude outwardly from a side of the mold resin 8 in a direction differing by 90 degrees from sides of the mold resin 8 from which the control terminal groups 7a to 7f protrude outwardly, a magnetic flux generated between the direct-current high-voltage terminal 31 and the direct-current low-voltage terminal 32 does not interlink with the control terminal groups 7a to 7f, enabling to prevent electromagnetic induction.

In FIG. 7, the directions of magnetic fields generated near the direct-current high-voltage terminal 31 and the direct-current low-voltage terminal 32 are indicated by symbols. Since the currents (indicated by arrows) flowing through the direct-current high-voltage terminal 31 and the direct-current low-voltage terminal 32, respectively, are in opposite directions, magnetic fields generated around the direct-current high-voltage terminal 31 and the direct-current low-voltage terminal 32 by each of the currents are only present between the direct-current high-voltage terminal 31 and the direct-current low-voltage terminal 32 and near the direct-current high-voltage terminal 31 and the direct-current low-voltage terminal 32, and cancel each other out at a sufficiently distant location.

Hence, stable operation of the IGBT chips and protection operation can be obtained without generating an induced electromotive force in the gate drive circuits of the IGBT chips, the temperature sensor circuits, etc.

Fourth Preferred Embodiment

Figure 9:
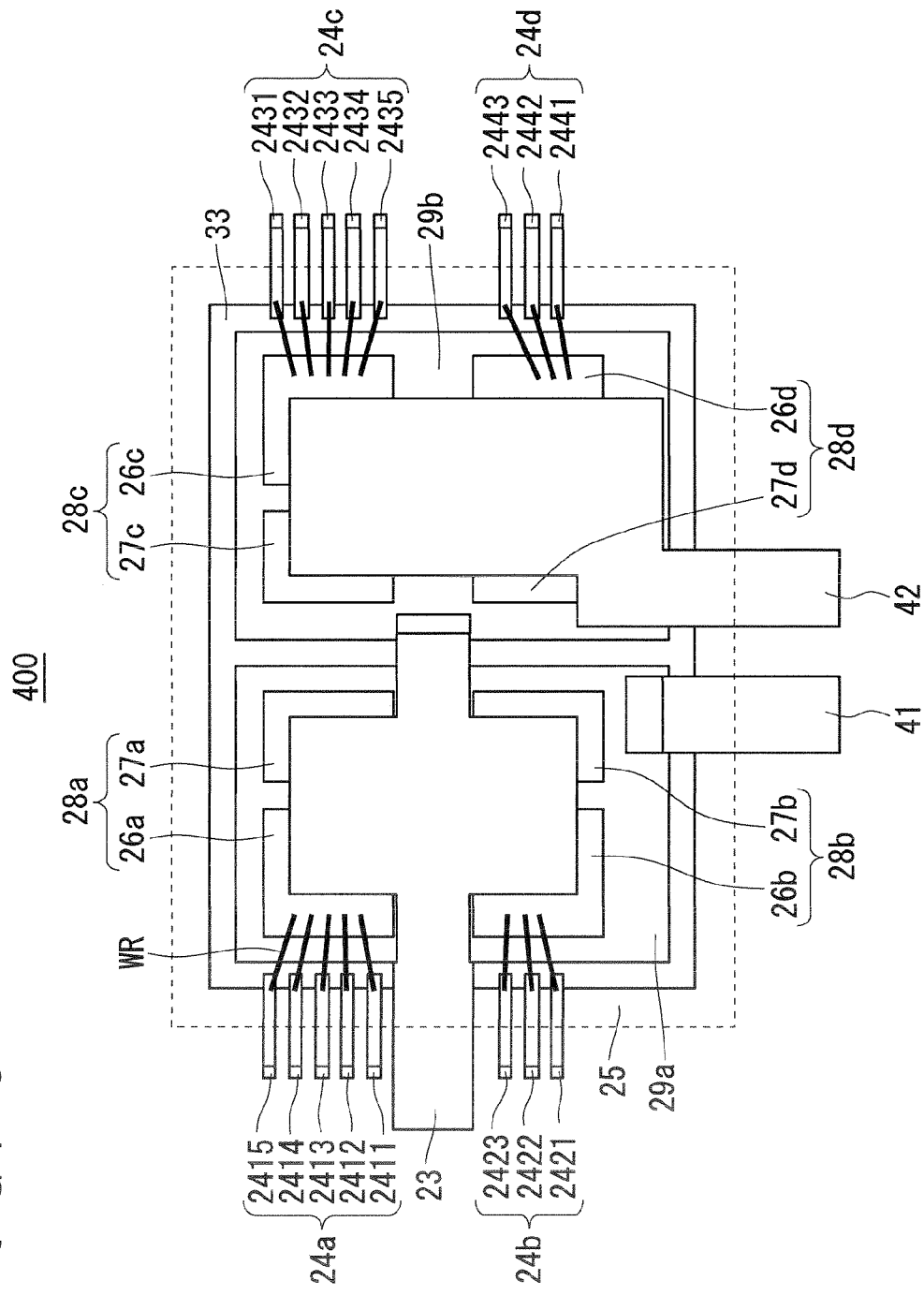
FIG. 9 is a plan view showing a configuration of a power semiconductor device module of a fourth preferred embodiment according to the present invention.

FIG. 9 is a plan view showing a configuration of a power semiconductor device module 400 of a fourth preferred embodiment according to the present invention, and FIG. 10 is a side view as viewed from the side of a direct-current high-voltage terminal 41 and a direct-current low-voltage terminal 42. In both drawings, a mold resin 25 is omitted. Note that the power semiconductor device module 400 has the same circuit configuration as the power semiconductor device module 200 of the second preferred embodiment, and forms a half-bridge circuit in which two semiconductor chip groups are connected in parallel with each other, and includes control terminals for detecting currents and temperatures to protect IGBT chips from overcurrent and overheat. Note that the same components as those of the power semiconductor device module 200 shown in FIGS. 4 and 5 are denoted by the same reference characters and overlapping description is omitted.

As shown in FIG. 9, in the power semiconductor device module 400, the direct-current high-voltage terminal 41 and the direct-current low-voltage terminal 42 are provided instead of the direct-current high-voltage terminal 21 and the direct-current low-voltage terminal 22, and the direct-current high-voltage terminal 41 and the direct-current low-voltage terminal 42 are configured to protrude outwardly from a side of the mold resin 25 in a direction differing by 90 degrees from sides of the mold resin 25 from which control terminal groups 24a to 24d protrude outwardly.

One end of the direct-current high-voltage terminal 41 is connected to a portion of an electrode pattern 29a adjacent to a diode chip 27b, and the other end protrudes from a side of the mold resin 25 closest thereto. One end of the direct-current low-voltage terminal 42 protrudes from the side of the mold resin 25 from which the direct-current high-voltage terminal 41 protrudes, so as to be adjacent and close to the direct-current high-voltage terminal 41.

With such a configuration, as in the third preferred embodiment, a magnetic flux generated near the direct-current high-voltage terminal 41 and the direct-current low-voltage terminal 42 does not link with the control terminal groups 24a to 24d, enabling to prevent electromagnetic induction. Hence, stable operation of the IGBT chips and protection operation can be obtained without generating an induced electromotive force in the gate drive circuits of the IGBT chips, the temperature sensor circuits, etc.

Note that the preferred embodiments may be freely combined or may be appropriately modified or omitted without departing from the spirit and scope of the present invention.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device module comprising:
a plurality of inverters, each having a first transistor and a second transistor, said first and second transistors being interposed in series between a first potential and a second potential and operating complementarily, and said plurality of inverters being assembled into a module, wherein
only one predetermined inverter of said plurality of inverters is configured to detect temperatures of said first and second transistors, and control terminals for detection of the temperatures of said first and second transistors protrude from sides of the module, and wherein
a first terminal and a second terminal protrude outwardly from a side of the module so as to be adjacent and close to each other, said first terminal providing said first potential to a set of said first transistors and being shared therebetween, said second terminal providing said second potential to a set of said second transistors and being shared therebetween.

2. The power semiconductor device module according to claim 1, wherein
said plurality of inverters share a common output terminal,
said first transistors in a set serving as a side of said first potential operate in a common manner,
said second transistors in a set serving as a side of said second potential operate in a common manner, and
the set of said first transistors and the set of said second transistors operate complementarily.

3. The power semiconductor device module according to claim 1, wherein
said first and second terminals protrude outwardly from a side of the module from which control terminal groups of said second transistors serving as a side of said second potential protrude, and
said second terminal protrudes from a location of said side of the module adjacent to said control terminal groups.

4. The power semiconductor device module according to claim 1, wherein
said first and second terminals protrude outwardly from a side in a direction differing by 90 degrees from a first side of the module from which first control terminal groups of said first transistors serving as a side of said first potential protrude, and from a second side of the module from which second control terminal groups of said second transistors serving as a side of said second potential protrude.

5. The power semiconductor device module according to claim 1, wherein said one predetermined inverter is one of said plurality of inverters that includes a first and a second transistor which have the highest possibility of increasing in temperature upon operation.

* * * * *